United States Patent
Benbow et al.

(10) Patent No.: US 7,454,550 B2
(45) Date of Patent: Nov. 18, 2008

(54) SYSTEMS AND METHODS FOR PROVIDING CO-PROCESSORS TO COMPUTING SYSTEMS

(75) Inventors: James B. Benbow, Skokie, IL (US); Gary A. Finley, Lake Forest, IL (US); Ravi V. C. Chandran, Hawthorn Woods, IL (US); Nathan A. Woods, Inverness, IL (US); Roman Kononov, Buffalo Grove, IL (US)

(73) Assignee: Xtremedata, Inc., Schaumburg, IL (US)

( * ) Notice: Subject to any disclaimer, the term of this patent is extended or adjusted under 35 U.S.C. 154(b) by 83 days.

(21) Appl. No.: 11/324,918

(22) Filed: Jan. 4, 2006

(65) Prior Publication Data

US 2006/0149883 A1 Jul. 6, 2006

Related U.S. Application Data

(60) Provisional application No. 60/593,290, filed on Jan. 5, 2005.

(51) Int. Cl.
*G06F 13/36* (2006.01)
(52) U.S. Cl. ................................ 710/306; 710/315
(58) Field of Classification Search ........... 710/306, 710/315
See application file for complete search history.

(56) References Cited

U.S. PATENT DOCUMENTS

| | | | |
|---|---|---|---|
| 4,638,442 A | 1/1987 | Bryant et al | |
| 4,908,772 A | 3/1990 | Chi | |
| 4,922,432 A | 5/1990 | Kobayashi et al | |
| 4,990,996 A | 2/1991 | Kumar et al | |
| 5,111,413 A | 5/1992 | Lazansky et al | |
| 5,195,130 A | 3/1993 | Weiss et al | |
| 5,313,637 A * | 5/1994 | Rose | 726/7 |
| 6,178,494 B1 | 1/2001 | Casselman | |
| 6,796,807 B2 * | 9/2004 | Olzak et al. | 439/76.1 |
| 6,903,941 B2 * | 6/2005 | Paola | 361/803 |
| 7,076,202 B1 * | 7/2006 | Billmaier | 455/3.04 |
| 2004/0063343 A1 * | 4/2004 | Murr | 439/69 |
| 2004/0225821 A1 | 11/2004 | Klein et al | |

OTHER PUBLICATIONS

Chu, W.W.S. Dimond, R.G. Perrott, S. Seng, S.P. and Luk, W. "Customisable EPIC Processor: Architecture and Tools," IEEE Design, Automation and Test in Europe Conference and Exhibition Designers Forum (Feb. 16-20, 2004.).

International Search Report and Written Opinion for PCT/US06/00203 issued on Dec. 5, 2007.

* cited by examiner

*Primary Examiner*—Clifford H Knoll
(74) *Attorney, Agent, or Firm*—McDonnell Boehnen Hulbert & Berghoff LLP

(57) ABSTRACT

Computing systems with conventional CPUs coupled to co-processors or accelerators implemented in FPGAs (Field Programmable Gate Arrays). One embodiment of the systems and methods according to the invention includes a FPGA accelerator implemented in a computer system by providing an adapter board configured to be used in a standard CPU socket.

42 Claims, 4 Drawing Sheets

SYSTEMS AND METHODS FOR PROVIDING CO-PROCESSORS TO COMPUTING SYSTEMS

This application claims the benefit of U.S. Provisional Application No. 60/593,290 filed Jan. 5, 2005.

FIELD OF THE INVENTION

The present invention is directed to computer systems. In particular, the present invention is directed to the use of processors, co-processors or accelerators in a computing system. More particularly, the present invention is directed to computing systems that include an adapter for adapting a processor, which may be a central processing unit, hereinafter, "CPU," and/or a co-processor to a processor socket on a motherboard of the computer system. The adaptation is enabled by use of a translator device, which in one embodiment includes a field programmable gate array, hereinafter, "FPGA," which permits the use of a processor and/or co-processor with a socket which was not specifically designed to operate directly with the type of processor and/or co-processor.

BACKGROUND OF THE INVENTION

A computer system typically includes a motherboard with a socket. The socket and associated support circuitry/devices on the motherboard is designed to supply power and signal input/output to a CPU having a set of predefined operating parameters for proper operation with or communication with the socket and other devices of the computer as is well known in the art.

It is sometimes desirable to provide additional functionality/capability or performance to a computer system and thus, motherboards are provided with means for receiving additional devices, typically by way of "expansion slots." Devices added to the motherboard by these expansion slots communicate via a standard bus. The expansion slots and bus are designed to receive and provide data transport of a wide array of devices, but have well-known design limitations.

One type of enhancement of a computer system involves the addition of a co-processor. The challenges of using a co-processor with an existing computer system include the provision of physical space to add the co-processor, providing power to the co-processor, providing memory for the co-processor, dissipating the additional heat generated by the co-processor and providing a high-speed pipe for information to and from the co-processor.

Without replacing the socket, which would require replacing the motherboard, the CPU cannot be presently changed to one for which the socket was not designed, which might be desirable in providing features, functionality, performance and capabilities for which the system was not originally designed.

Presently, neither of these upgrades or performance enhancements may be performed without redesigning parts of or the entire system or accepting, in the case of a co-processor, the design limitations of known expansion options.

Present day computer system housings tend to be designed with small footprints in order to reduce the space needed for the computer enclosure. Similarly, space is not easily found on or around present motherboards, which tends to be designed in a compact form, not just to save space, but also to minimize distances that signals have to travel in order to maximize speed of the system. Increasing the density of the system tends to increase the difficulty of removing the heat generated by components of the system. Providing memory, power and a high-speed bus to and from the co-processor, without replacing the motherboard or substantial redesign, is an additional design challenge.

As a result, present day computer systems incorporating present CPUs or such a co-processor are designed from the beginning to incorporate the CPU or co-processor or to tolerate addition of the co-processor which leads to the above-noted design compromises, including being provided via a PCI board, for example.

FPGA accelerators and the like, including counterparts therefore, e.g., application-specific integrated circuits (ASIC), are well known in the high-performance computing field. Nallatech, (see www.nallatech.com) is an example of several vendors that offer FPGA accelerator boards that can be plugged into standard computer systems. These boards are built to conform to industry standard I/O (Input/Output) interfaces for plug-in boards. Examples of such industry standards include: PCI (Peripheral Component Interconnect) and its derivatives such as PCI-X and PCI-Express. Some computer system vendors, for example, Cray, Inc., (see www.cray.com) offer built-in FPGA co-processors interfaced via proprietary interfaces to the CPU.

FPGAs can provide significant performance boosts to conventional processor based computing systems. In the same way that software can be downloaded into a CPU (processor) to perform specific tasks, "firmware" or software that is embedded in a hardware device, can be downloaded into an FPGA to perform specific tasks. A key difference lies in the difference between software and FPGA firmware. Software includes a set of pre-defined instructions that can run on a pre-defined hardware engine (a CPU). On the other hand, FPGA firmware can define a custom hardware engine and provide a set of custom instructions that can run on this engine. This flexibility allows the FPGA to implement optimized hardware engines to implement specific tasks, offering the potential to greatly accelerate CPU functions and the overall performance of the computer system.

Typical FPGA accelerator boards include the following basic components: a FPGA, FPGA firmware memory, data memory, a high-speed interface to one or more CPU and FPGA support circuitry, i.e., power regulators and clock generators. The high-speed interface to the CPU is typically an industry standard I/O interface like PCI. In the prior art, all of the above components are integrated onto a standard PCI, or other, plug-in board. As noted above, one of the engineering issues in designing and building such a plug-in board is related to the power supply and whether the I/O interface (PCI or other) can supply the correct power levels (voltage and current) for the FPGA board. Another engineering issue is related to physical space and whether the computer system chassis can accommodate the plug-in board. Yet another issue is related to heat dissipation and whether the computer system chassis can provide adequate airflow to cool the FPGA board and other necessary hardware. These issues conspire to restrict the usage of FPGA boards to the class of computer systems that have the correct capabilities. The present invention is a solution that enables FPGAs to be used in a wider range of computer systems, including high-density blade systems that may not have provisions for expansion slots.

There is a demand for incorporating co-processors and different CPUs into existing computer systems that addresses the above shortcomings. The present invention satisfies the demand.

SUMMARY OF THE INVENTION

FPGA accelerators or co-processors are well known in the high-performance computing field. The present invention describes an innovative solution that enables FPGAs and the like to be easily integrated into standard computer systems. The current invention also includes systems and methods to enable FPGAs, and other processors and co-processors, to be integrated into standard computer systems without modification to existing hardware and without requiring major changes to the computer BIOS, for example. The invention contemplates the adaptation of a CPU to a socket not designed to operate the CPU, by way of a socket adapter and I/O translator. Thus, the invention has significant advantages over the current method of I/O-interfaced plug-in boards.

For purposes of the present application the terms "processor" and "CPU" both refer to a central processing unit, and contemplates all types of primary processors used in computing. The term "FPGA" refers to a field programmable gate array, and contemplates any semiconductor device that can be programmed to define a hardware engine that performs different functions. The term "server" includes multiple-CPU systems. The term "PCB" refers to a printed circuit board. The term "motherboard" refers to any PCB that is designed with sockets to accept CPUs, which includes, but is not limited to industry standard PC and server motherboards, processing blades and other custom CPU platforms. The term "ATX" is a PC (personal computer) motherboard standard. Please see http://formfactors.org/developer/specs/stx/stx2_1.pdf which is incorporated herein by reference. Processors may also refer to any primary CPU or one of multiple CPUs. Co-processors may refer to any integrated circuit device that can be programmed to perform different functions. Co-processors may include DSPs, FPGAs and ASICs. The term "ASIC" refers to application-specific integrated circuits which are special-purpose hardware engines. The term "DSP" refers to a specialized software programmable CPU used for digital signal processing. The term, "I/O translator" may refer to a semiconductor device which resides on an adapter of the present invention for use connected to a processor socket and performs the function of bridging a socket and any devices attached thereto via the adapter, such as a processor for which the socket was not expressly designed or a co-processor. The I/O translator may be all or part of a FPGA, or all or part of an ASIC, for example.

Personal computers (PCs) and multiple-CPU computer servers today are typically built on "Motherboards." A motherboard is a large PCB that includes all memory and I/O interfaces; and includes one or more sockets; each for receiving a CPU. These motherboards are built to industry standards, for example the ATX standard for Intel x86-based CPUs. These motherboards use standard sockets for the CPUs, for example, Socket-604 for the Intel Xeon CPU and Socket-940 for the AMD Opteron CPU. The specifications for these motherboards and sockets are freely available to the public. On the motherboard, each CPU-socket is connected to memory, and all other supporting circuitry, including power supply for the CPU. In the present invention, an adapter board with an I/O translator and with support circuitry is build to fit with and communicate using the existing physical and electrical properties and specifications of a standard CPU-socket.

As noted earlier, there are significant engineering issues involved in the design of I/O-interfaced plug-in boards. These issues presently restrict the deployment of such boards to a certain subset of computer systems. The present invention will enable processors, co-processors, like CPUs and FPGAs to be deployed in a much wider set of computer systems that have one or more standard CPU sockets available. The adapter board according to the present invention is also capable of using motherboard resources available to the socket, for example, memory and interfaces to other devices on the motherboard. This greatly simplifies the design of the adapter board and also greatly reduces costs. The current invention will therefore enable low-cost deployment of different processors, co-processors, like FPGAs in a wide class of computer systems.

In one aspect of the invention, a PCB adapter board is provided which is configured, sized and shaped to be received and placed in communication with a standard CPU socket on a first side thereof. A second side of the adapter board includes connections configured, sized and shaped to connect to and communicate with an I/O translator and one or more of a processor, and co-processor, e.g., a FPGA device. Circuitry on the adapter permits the I/O translator and the processor or co-processor, like a FPGA device, to be powered by and communicate through the adapter and thus communicate with other devices on a computer motherboard in communication with the CPU socket.

One aspect of the invention provides an adapter board for use in a computer having one or more CPU sockets, including a printed circuit board including a first side and a second side opposite the first side. A plurality of first connectors is disposed on the first side configured to be connected to and in communication with the CPU socket. A plurality of second connectors is disposed on the second side configured to be connected to an I/O translator; and circuitry is associated with the printed circuit board connecting the plurality of first and second connectors to enable communication therebetween. The plurality of second connectors also receives one or more of a processor and a co-processor.

Further aspects of the invention optionally provide a pin base disposed adjacent an underside of the printed circuit board. The second connectors may include solder balls positioned to operatively connect the printed circuit board to a co-processor. The circuitry may include a plurality of traces. The circuitry may include support devices for supporting the function of a co-processor. The support devices may include one or more of RAM, ROM, a PLD device, a power conditioner, and an oscillator or other frequency reference. The adapter board may be sized and shaped to accommodate a heat sink. The adapter board may be sized and shaped to be received in a CPU socket. The first connectors may include a plurality of pins extending through the pin base. Each of the pins may terminate in a solder pad adjacent the underside of the printed circuit board and operably connect to the circuitry.

Another aspect of the invention provides an adapter board for providing one or more of a processor and a co-processor to a computer, wherein the computer has one or more CPU socket, including a printed circuit board including a first side and a second side opposite the first side. The plurality of first connectors is disposed on the first side configured to be connected to and in communication with the CPU socket. An I/O translator is operably connected to the printed circuit board and provided in communication with the plurality of first connectors to bridge between the CPU socket and one or more of a processor and a co-processor on the adapter.

Further aspects of the invention provide a pin base including the first connectors, the pin base being disposed adjacent an underside of the printed circuit board. Second connectors may be provided, the second connectors including solder balls positioned to operatively connect the printed circuit board to the I/O translator and a processor/co-processor. The I/O translator is preferably a FPGA. The co-processor may be a FGPA, DSP or an ASIC, for example. The circuitry may operatively connect the first and second connectors. The circuitry may include support devices for supporting the function of an I/O translator, processor and/or co-processor. The support devices may include one or more of RAM, ROM, a PLD device, a power conditioner, and an oscillator or other frequency reference. The adapter board may be sized and shaped to accommodate a heat sink. The adapter board may be sized and shaped to be received in a CPU socket. The first connectors may include a plurality of pins extending through the pin base. Each of the pins terminates in a solder pad adjacent the underside of the printed circuit board and operably connects to the co-processor through circuitry on the printed circuit board.

Further aspects of the invention provide a computer system including one or more CPU sockets, including an adapter board disposed in and in operable communication with one of the one or more CPU sockets. An I/O translator is disposed on the adapter board and circuitry operably connects a processor and/or a co-processor connected to the adapter to the socket connectors. The co-processor may be a FPGA or a DSP or an ASIC. The adapter board may further include support devices for supporting the function of the processor or co-processor.

Yet further aspects of the invention provide a computer system having two or more CPU sockets, including an adapter board disposed in one of the two or more CPU sockets. An I/O translator is disposed on the adapter board and circuitry operably connects the I/O translator to the one of the two or more sockets. The I/O translator may be in the form of a FPGA. The adapter board may further include support devices for supporting the function of the processor and/or co-processor attached thereto.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

DETAILED DESCRIPTION OF THE PRESENTLY PREFERRED EMBODIMENTS

Figure 1:
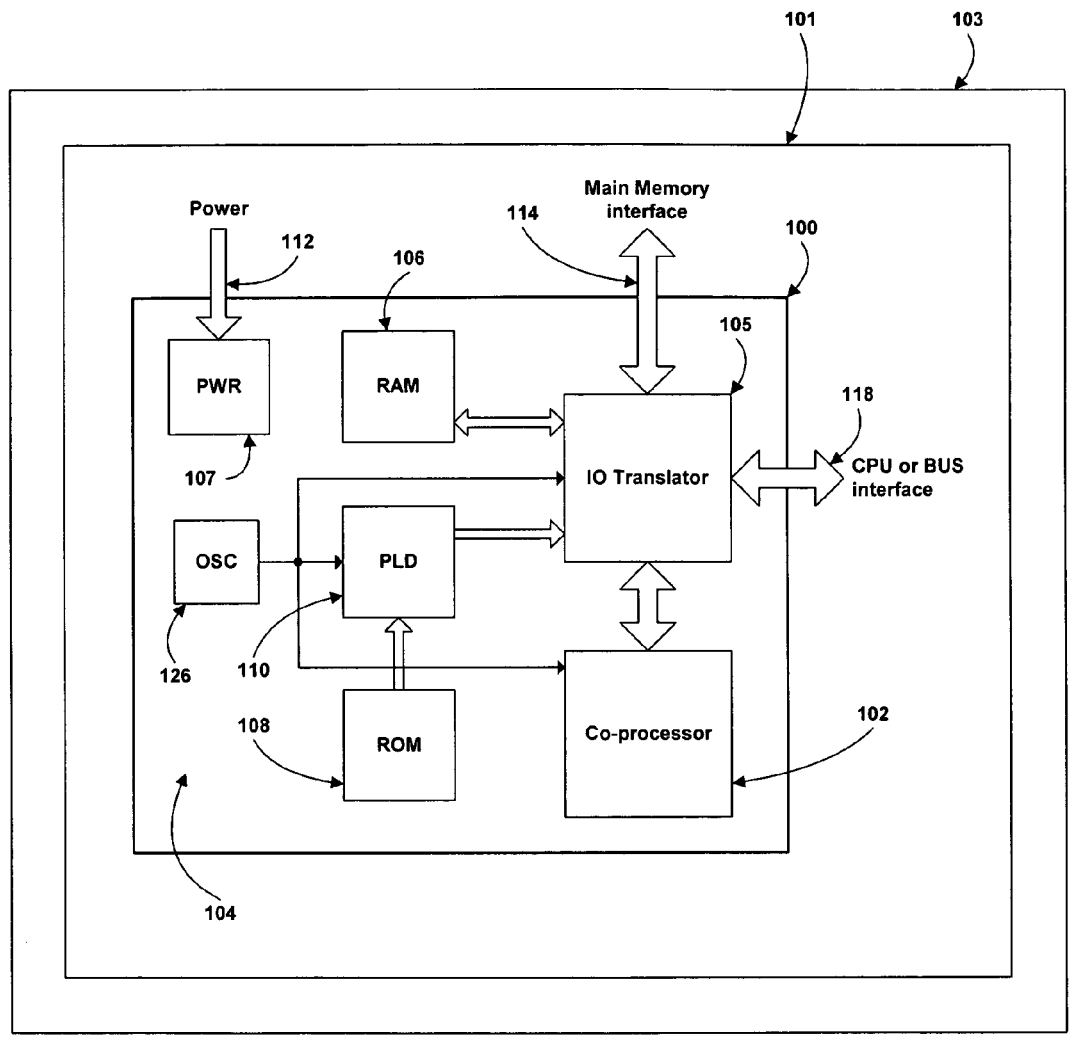
FIG. 1 shows a block diagram of one embodiment of an adapter board according to the present invention and a motherboard in a computer.

In the most general embodiment, the present invention contemplates an adapter board, which is configured to be connected to a CPU socket of a motherboard of a computer and includes connections to receive an I/O translator which functions to bridge the functioning or operations or conform operating conditions between the socket and a processor and/or co-processor on an opposite side thereof. One example of such an adapter board 100 is shown in FIG. 1. In use, the adapter board 100 is connected to a socket 120 (see FIG. 2) on a motherboard 101, which forms part of a computer 103 (not to scale).

The adapter board 100 shown includes an I/O translator 105. The adapter board 100 includes a processor/co-processor 102 connected to the I/O translator 105, which forms a bridge or operative adaptation function between the socket 120 and the processor/co-processor. The device 102 may be a CPU, or a co-processor, like a FPGA or ASIC, etc., or a combination thereof.

The I/O translator 105 may be a portion of a co-processor 102. In one embodiment, the functions of the I/O translator 105 and co-processor 102 are combined in a single FPGA.

The adapter board 100 includes support components 104, connected to the adapter board and provided in communication with the processor/co-processor 102 and I/O translator 105 to support the functions thereof. The adapter board 100 is sized, shaped and configured so as to enable operation when a processor/co-processor 102 is attached thereto and when the adapter board 100 is connected to a CPU socket (see FIG. 2) on the motherboard 101.

The support components 104 may include ROM 106 (read only memory), RAM 108 (random access memory), PLD 110 (programmable logic device) and an oscillator 126 or other frequency reference. Other components desired for operation of the processor/co-processor 102 and I/O translator 105 are provided as needed by the particular requirements of the hardware specified. The specifics of the design of the adapter board 100 is within the knowledge of one of ordinary skill in the art, who will be able to incorporate the processor/co-processor 102 and other components 104 into and provide communication with the specific socket 120 (see FIG. 2) via I/O translator 105 and other circuitry.

As noted above and shown in FIG. 1, the adapter board 100 may contain support circuitry 104 necessary for operation of the processor/co-processor 102 and I/O translator 105. The support circuitry 104 may include devices for clock generation, firmware storage and re-loading of firmware into the processor/co-processor 102 and I/O translator 105. The processor/co-processor 102 and I/O translator 105 can also use the motherboard 101 resources (not shown) that are available for the CPU. This may include use of interfaces to main memory 114, and interfaces 118 to other CPUs or other devices on the motherboard 101. Power conditioning devices 107 may also be included as known in the art to provide proper levels of power to each of the devices 102, 104, 105 as required.

Figure 2:
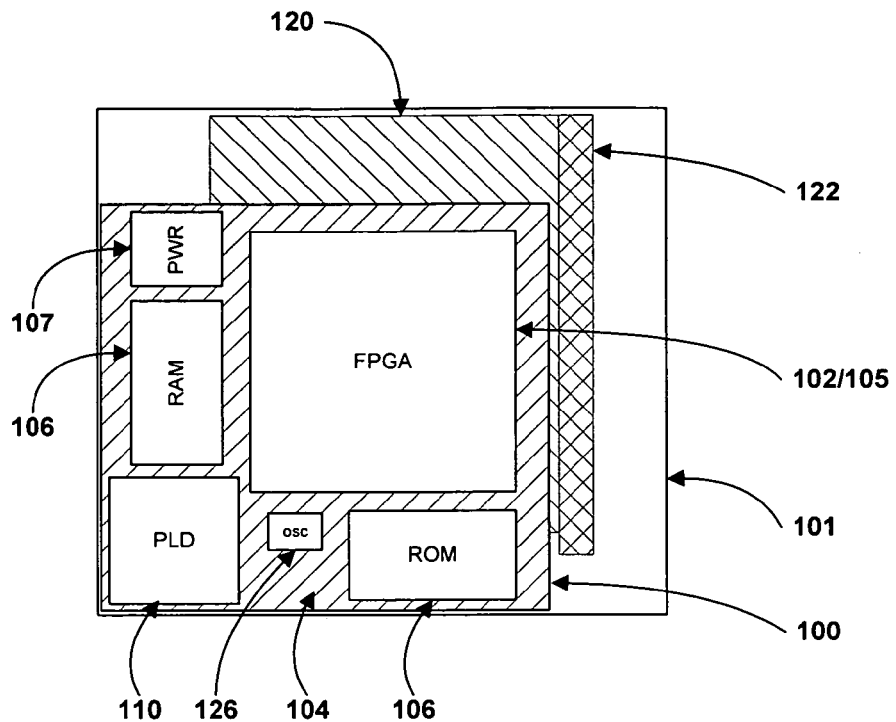
FIG. 2 shows a top view block diagram of another embodiment of an adapter board connected to a socket.
Figure 4:
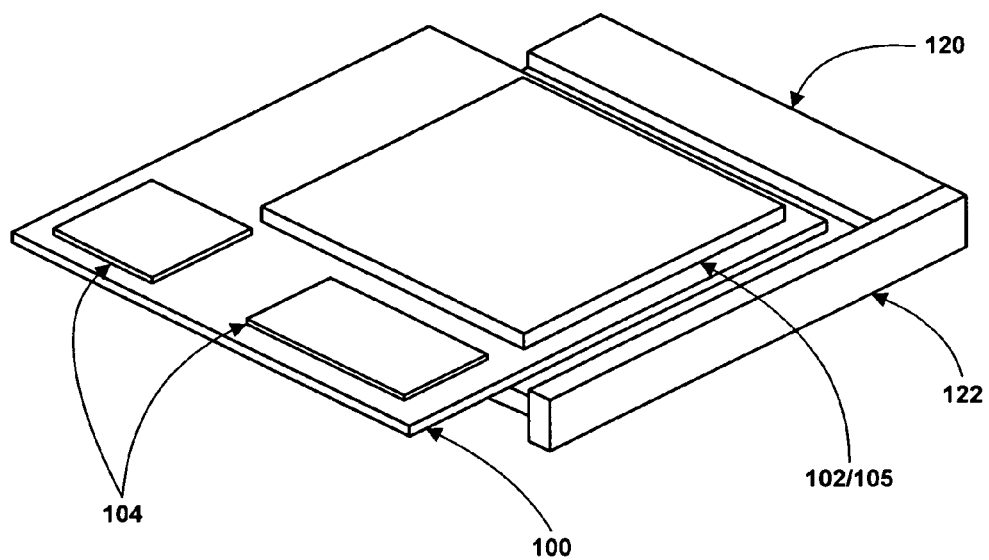
FIG. 4 shows a perspective view of yet another embodiment of an adapter board and socket.

Turning to FIGS. 2 and 4, the adaptor board 100 in a top view is shown connected to and in communication with a socket 120, originally intended for use with a CPU. The socket 120 is shown with a socket cam lever 122, for securing the adapter board 100 in place once connected to the socket 120. The socket 120 is shown connected to a subsection of a representation of a motherboard 101.

In a presently preferred example, the adapter board 100 is designed for a Socket-940 (Please see http://www.amd.com/us-en/assets/content_type/white_papers_and_tech_docs/25766.pdf and http://www.amd.com/us-en/assets/content_type/white_papers_and_tech$_{13}$ docs/31412.pdf which are incorporated herein by reference), originally designed for an AMD Opteron CPU. The present example also implements the co-processor and the I/O translator 102/105 as a single device. It will be understood that the present invention contemplates adapter boards designed for any CPU-socket and is not restricted to the present example and contemplates adaptation of any processor and/or co-process therefor. However, the present example is preferred presently because of the AMD open bus architecture, utilizing the Hypertransport bus specification (Please see http://www.hypertransport.org/tech/tech_specs.cfm which is incorporated herein by reference), which permits the present invention to be adapted therefor without reverse engineering of any proprietary bus architecture. Additionally, the present example is preferred presently because a generally desired coprocessor solution is an FPGA, which can integrally accommodate the I/O translator.

Such an adapter board 100 can be plugged into a standard motherboard 101 CPU-socket 120 in place of a CPU. In use, an I/O translator, processor/co-processor 102/105, along with support circuitry 104, on an adapter board 100, is plugged into a socket 120 on a motherboard 101. The support circuitry 104 included in this example is RAM 108, an oscillator 126, a PLD 110, and ROM 106.

Other support devices 107 may be needed to condition power 112, for example, from the socket 120. In this example, the primary power source from the socket is what is commonly referred to as the CPU "core" voltage. The desired voltage level on this supply is expected to be programmed by the CPU via a set of digital values. Through this feature of the socket, the desired voltage can be set with resistors or other means on the adapter board 100. Other power rails that are needed on the adapter board 100 can be derived from this supply via appropriate voltage regulators, the techniques of which are commonly applied in the industry. Additionally, there may be additional power supplies available on the socket, for example the memory interface power supply, which can be utilized directly or through modification by the adapter 100.

The current example adapter board 100 has some interaction with the motherboard BIOS. Devices that connect to the Hypertransport bus go through a process of discovery wherein the BIOS interrogates attached devices to determine their function and resource requirements. Some BIOSes expect only the appropriate CPU in the socket and will stop the system boot process if an unexpected device is encountered. This type of BIOS may be slightly modified to ignore the fact that the adapter board is not the expected CPU. Once the system boots, appropriate system software can be used to configure the adapter board 100 for use.

When in communication with a motherboard 101, the adapter board 100 enables electrical connections between the processor/co-processor 102/105 and the motherboard 101 through socket 120 via I/O translator 102/105. These connections will be such that the processor/co-processor 102/105 can access the motherboard 101 resources intended for use by a CPU. These resources (not shown) include power supply, main memory, monitoring circuitry (such as JTAG, I2C) and others as is known in the art. Details and examples of the connections are discussed below.

Figure 3:
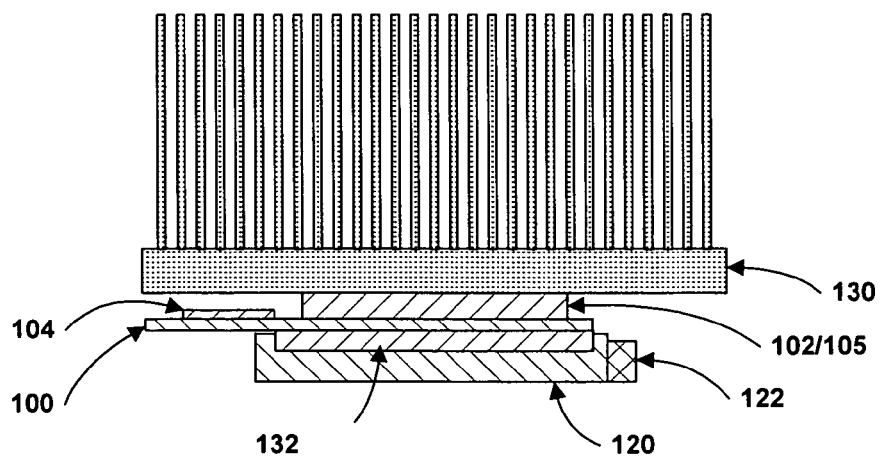
FIG. 3 shows a cross section side view of the adapter board of FIG. 2.

Such an adapter board 100 will preferably conform to the physical size and shape of the space allowed on standard motherboards for the CPU. Turning to FIG. 3, the size and shape of the adapter board 100 contemplates accommodating a heat sink 130 that is normally placed on top of the CPU for cooling purposes. An industry-standard or custom heat sink 130 can be mounted over the adapter board 100 and on the processor/co-processor 102/105 to dissipate heat.

Further aspects of the embodiment shown include the adapter board 100 mounted and connected to socket 120 and locked in place with socket cam lever 122. The adapter board 100 includes processor/co-processor 102/105 and support components 104. The adapter board 100 is attached and provided in communication with socket 120 via pin base 132 or a like element.

The design of such an adapter board 100 and associated elements, and adaptation to the specifications of a socket 120 can be implemented by any person ordinarily skilled in the art. The construction of such boards is also well understood and several vendors specialize in this field, for example, ISI and Emulation Technology. The described implementation is one of several possible and is only used as an illustration. The invention contemplates adapter boards that could contain one or more processor/co-processor and associated support circuitry including an I/O device for bridging the specific environment presented by the socket and the requirements and operating parameters of any processor/co-processor on the adapter. These boards could be built to plug into any CPU socket. Advantageously, the adapter makes possible the use of any CPU or co-processor in any socket by using an I/O translator to adapt the operating conditions of the IC on the adapter to the socket.

Figure 5:
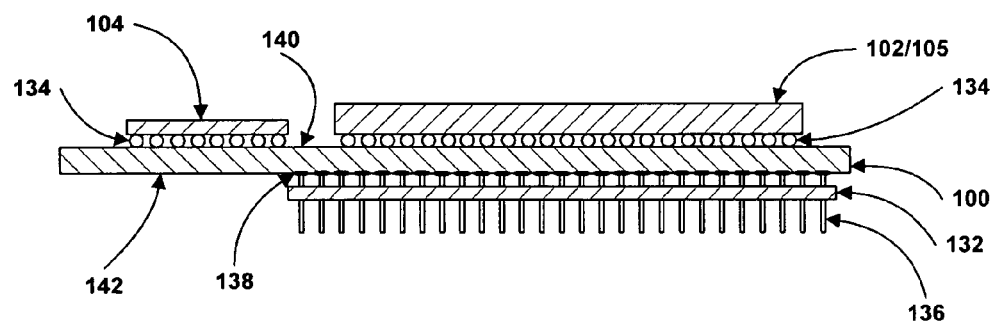
FIG. 5 shows a cross section side view of an adapter board of the present invention.
Figure 6:
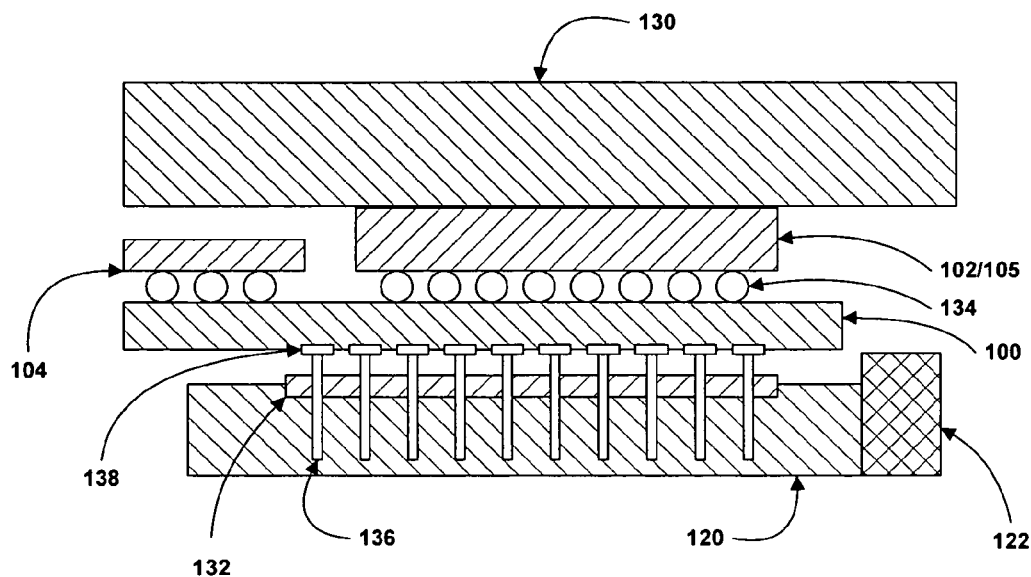
FIG. 6 shows a cross section side view of an adapter board, socket and heat sink according to the present invention.
Figure 7:
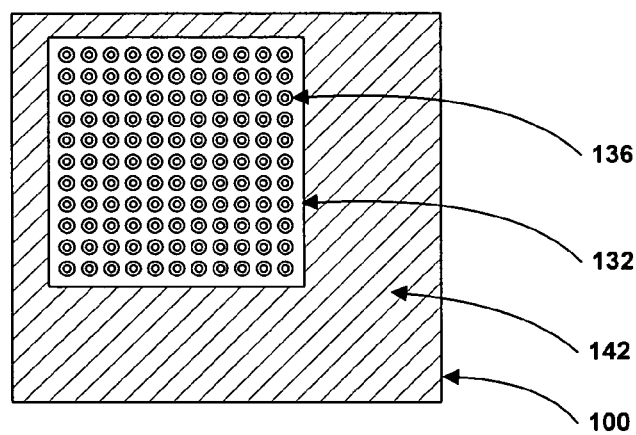
FIG. 7 shows a bottom view of an adapter board according to the present invention.

A preferred mechanism detailing how the connection may be made between the present adapter board 100 and a computer processor socket 120 is shown in FIGS. 5, 6 and 7. For example, the adapter board 100 may include a combined I/O translator/co-processor 102/105 on a top side 140 thereof and associated support components 104. The combined I/O translator/co-processor 102/105 and support components 104 may be connected to the adapter board 100 by way of a plurality of solder balls 134, as is known in the art. Positioned adjacent and in contact with the co-combined I/O translator/co-processor 102/105 may be a heat sink 130 (see FIG. 6).

The adapter board 100 may be connected to a pin base 132. The pin base 132 includes pins 136 which extend through and below the pin base. The pins 136 are positioned and sized and shaped to be received in socket 120 and locked in place with socket cam lever 122. The tops of the pins 136 terminate in solder pads 138, which place the adapter board 100 in communication with socket 120 when the solder pads are contacted by electrical connections or traces (not shown) exposed on the bottom 142 of the adapter board. Other suitable means of electrically and physically connecting the combined I/O translator/co-processor 102/105 to the adapted board 100, and the adapted board to the socket 120 are contemplated.

Some of the embodiments illustrated herein are designed to provide a co-processor in a computer having two or more CPU sockets, wherein the adapter board and combined I/O translator/co-processor are configured to operate through the socket, originally intended to receive one of the two or more CPUs. Other embodiments of the present invention contemplate using an adapter board to receive both a CPU and a co-processor in a single motherboard socket.

It should be understood that the above description of the preferred embodiment, alternative embodiments, and specific examples are given by way of illustration and not limitation. For example, the features described herein could be incorporated into any variation of a computer having one or more sockets for a CPU. Many changes and modifications within the scope of the present embodiments may be made without departing from the spirit thereof, and the present invention includes all such changes and modifications.

What is claimed is:

1. An adapter board for use in a computer having a motherboard that includes one or more CPU sockets, the adapter board comprising:

a printed circuit board including a first side and a second side opposite the first side;

the first side including a plurality of first connectors configured to be connected to and in communication with a first CPU socket of the one or more CPU sockets of the motherboard, wherein the first CPU socket is associated with a first set of operating parameters;

the second side including a plurality of second connectors configured to be connected to an I/O translator device that is communicatively coupled to one or more of a processor and a co-processor, wherein the one or more of the processor and the co-processor are associated with a second set of operating parameters different than the first set of operating parameters;

the I/O translator device connected to the second connectors, wherein the I/O translator device translates between the first and second sets of operating parameters; and circuitry associated with the printed circuit board connecting the pluralities of first and second connectors to enable communication between the motherboard and the one or more of the processor and co-processor.

2. The adaptor board of claim 1, wherein the one or more of the processor and the co-processor comprises the co-processor, and wherein the co-processor is all or a portion of an FPGA, ASIC, or DSP.

3. The adapter board of claim 1, further including a pin base disposed adjacent the first side of the printed circuit board.

4. The adapter board of claim 1, wherein the second connectors include solder balls.

5. The adapter board of claim 4, wherein the one or more of the processor and the co-processor comprises the co-processor, and wherein at least a portion of the solder balls are positioned to operatively connect the printed circuit board to the co-processor.

6. The adapter board of claim 4, wherein the one or more of the processor and the co-processor comprises the processor, and wherein at least a portion of the solder balls are positioned to operatively connect the printed circuit board to the processor.

7. The adapter board of claim 4, wherein at least a portion of the solder balls are positioned to operatively connect the printed circuit board to the one or more of the processor and the co-processor.

8. The adapter board of claim 1, wherein the circuitry includes a plurality of traces.

9. The adapter board of claim 8, wherein the one or more of the processor and the co-processor comprises the co-processor, and wherein the circuitry includes support devices for supporting the function of the co-processor.

10. The adapter board of claim 9, wherein the support devices include one or more of RAM, ROM, a PLD device, a power conditioner, and an oscillator or other frequency reference.

11. The adapter board of claim 1, wherein the adapter board is sized and shaped to accommodate a heat sink.

12. The adapter board of claim 1, wherein the adapter board is sized and shaped to be received in the first CPU socket.

13. The adapter board of claim 3, wherein the first connectors include a plurality of pins extending through the pin base.

14. The adapter board of claim 13, wherein each of the pins terminate in a solder pad adjacent the first side of the printed circuit board and operably connect to the circuitry.

15. The adapter board of claim 1, wherein the one or more of the processor and the co-processor comprises the co-processor, and wherein the I/O translator device and the co-processor are combined into a single device.

16. An adapter board for providing a co-processor to a computer, the computer having a motherboard that includes one or more CPU sockets, the adapter board comprising:

a printed circuit board including a first side and a second side opposite the first side;

a plurality of first connectors disposed on the first side configured to be connected to and in communication with a first CPU socket of the one or more CPU sockets of the motherboard, wherein the first CPU socket is associated with a first set of operating parameters; and a co-processor operably connected to the printed circuit board and provided in communication with the plurality of first connectors, wherein the co-processor is associated with a second set of operating parameters different than the first set of operating parameters, the adapter board further comprising an I/O translator that translates between the first and second sets of operating parameters.

17. The adapter board of claim 16, further including a pin base including the first connectors, the pin base disposed adjacent the first side of the printed circuit board.

18. The adapter board of claim 16, further including a plurality of second connectors, the second connectors including solder balls positioned to operatively connect the printed circuit board to the co-processor.

19. The adapter board of claim 16, wherein the co-processor is an FPGA.

20. The adapter board of claim 16, wherein the co-processor is a DSP.

21. The adapter board of claim 16, wherein the co-processor is an ASIC.

22. The adapter board of claim 18, further including circuitry operatively connecting the first and second connectors.

23. The adapter board of claim 22, wherein the circuitry includes support devices for supporting the function of the co-processor.

24. The adapter board of claim 23, wherein the support devices include one or more of RAM, ROM, a PLD device, a power conditioner, and an oscillator or other frequency reference.

25. The adapter board of claim 16, wherein the adapter board is sized and shaped to accommodate a heat sink.

26. The adapter board of claim 16, wherein the adapter board is sized and shaped to be received in the first CPU socket.

27. The adapter board of claim 17, wherein the first connectors include a plurality of pins extending through the pin base.

28. The adapter board of claim 27, wherein each of the pins terminates in a solder pad adjacent the first side of the printed circuit board and operably connects to the co-processor through circuitry on the printed circuit board.

29. A computer system including a motherboard with a CPU socket, the computer system comprising:

an adapter board disposed in and in operable communication with the CPU socket, wherein the CPU socket is associated with a first set of operating parameters; and a processor and a co-processor disposed on the adapter board and in communication with the socket through an I/O translator, wherein the processor and the co-processor are associated with a second set of operating parameters different than the first set of operating parameters, wherein the I/O translator translates between the first and second sets of operating parameters.

30. The computer system of claim 29, further comprising an FPGA, wherein the FPGA comprises the co-processor and the I/O translator.

31. The computer system of claim 29, wherein the adapter board further includes support devices for supporting the function of the co-processor.

32. A computer system having a motherboard that includes two or more CPU sockets, the computer system comprising:
an adapter board disposed in a first CPU socket of the two or more CPU sockets of the motherboard, wherein the first CPU socket is associated with a first set of operating parameters, the adapter board including a co-processor associated with a second set of operating parameters different than the first set of operating parameters, the adapter board further including an I/O translator to adaptively permit communication between the first CPU socket having the adapter board connected directly thereto, wherein the I/O translator translates between the first and second sets of operating parameters.

33. The computer system of claim 32, wherein the co-processor and the I/O translator are combined in an FPGA.

34. The computer system of claim 32, wherein the adapter board further includes support devices for supporting the function of the co-processor.

35. A computer system including a motherboard with a CPU socket, the computer system comprising:
an adapter board disposed in and in operable communication with the CPU socket, wherein the CPU socket is associated with a first set of operating parameters; and
a processor disposed on the adapter board and in communication with the socket through an I/O translator to adapt the function of the processor to the CPU socket, wherein the processor is associated with a second set of operating parameter different than the first set of operating parameters, and wherein the I/O translator translates between the first and second sets of operating parameters.

36. A computer system including a motherboard with a CPU socket, the computer system comprising:
an adapter board disposed in and in operable communication with the CPU socket, wherein the CPU socket is associated with a first set of operating parameters;
an FPGA connected to the adapter board, wherein the FPGA is associated with a second set of operating parameters different than the first set of operating parameters; and
an I/O translator in communication with the FPGA and the CPU socket to adapt the function of the FPGA to the CPU socket, wherein the I/O translator translates between the first and second sets of operating parameters.

37. A computer system including a motherboard with two or more CPU sockets, the two or more CPU sockets in communication with each other through a bus, the computer system comprising:
an adapter board disposed in and in operable communication with a first CPU socket of the two or more CPU sockets, wherein the first CPU socket is associated with a first set of operating parameters;
an FPGA connected to the adapter board, wherein the FPGA is associated with a second set of operating parameters different than the first set of operating parameters;
an I/O translator in communication with the FPGA and the first CPU socket to adapt the function of the FPGA to the first CPU socket, wherein the I/O translator translates between the first and second sets of operating parameters; and
a CPU disposed in a second CPU socket of the two or more CPU sockets and in operable communication with each of the other of the two or more CPU sockets, wherein the FPGA and the CPU are in communication through the bus.

38. A computer system comprising:
a motherboard; and
an adapter board,
wherein the motherboard includes a first CPU socket including a first CPU disposed therein, and a second CPU socket having the adapter board disposed therein, wherein the adapter board replaces a second CPU when the adapter board is disposed in the second CPU socket, wherein both the second CPU and the second CPU socket are associated with a first set of operating parameters, and
wherein the adapter board includes an I/O translator device and a co-processor, wherein the co-processor is associated with a second set of operating parameters different than the first set of operating parameters, wherein the I/O translator device translates between the first and second sets of operating parameters to enable the co-processor to operate in conjunction with the motherboard and the first CPU via the second CPU socket.

39. The computer system of claim 38, wherein the motherboard includes a first plurality of motherboard resources designed according to the first set of operating parameters, and wherein the I/O translator device is further arranged to enable the co-processor to use the first plurality of motherboard resources.

40. The computer system of claim 39, wherein the first plurality of motherboard resources includes at least one of a CPU bus, data storage, power supply, and a communication interface.

41. The computer system of claim 38, wherein the second CPU socket includes a plurality of pin sockets that are designed to receive a corresponding first plurality of pins from the second CPU, wherein the co-processor includes a second plurality of pins, and wherein the I/O translator device bridges pin connections from the second plurality of pins to the first plurality of pin sockets.

42. The computer system of claim 38, wherein the co-processor is at least one of an FPGA, ASIC, and DSP.

* * * * *